United States Patent
Japp et al.

(10) Patent No.: US 6,496,356 B2
(45) Date of Patent: Dec. 17, 2002

(54) MULTILAYER CAPACITANCE STRUCTURE AND CIRCUIT BOARD CONTAINING THE SAME AND METHOD OF FORMING THE SAME

(75) Inventors: Robert M. Japp, Vestal, NY (US); John M. Lauffer, Waverly, NY (US); Konstantinos I. Papathomas, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/026,873

(22) Filed: Dec. 21, 2001

(65) Prior Publication Data

US 2002/0080556 A1 Jun. 27, 2002

Related U.S. Application Data

(60) Continuation of application No. 09/655,381, filed on Sep. 5, 2000, now Pat. No. 6,343,001, which is a continuation-in-part of application No. 09/022,258, filed on Feb. 11, 1998, now Pat. No. 6,256,850, which is a division of application No. 08/662,164, filed on Jun. 12, 1996, now Pat. No. 5,796,587.

(51) Int. Cl.[7] .............................................. H01G 4/228
(52) U.S. Cl. .................. 361/306.3; 361/328; 361/306.2
(58) Field of Search ................................ 361/763–764, 361/766, 738–739, 301.3, 301.4, 321.2, 328, 306.2, 306.3, 311–313; 174/260, 263

(56) References Cited

U.S. PATENT DOCUMENTS

| | | | |
|---|---|---|---|
| 3,635,759 A | 1/1972 | Howatt | 117/212 |
| 4,035,768 A | 7/1977 | Boldridge, Jr. et al. | 340/146.3 |
| 4,241,378 A | * 12/1980 | Dorrian | 264/615 |
| 4,775,573 A | 10/1988 | Turek | 428/209 |
| 4,792,779 A | 12/1988 | Pond et al. | 338/195 |
| 4,835,656 A | 5/1989 | Kitahara et al. | 361/321 |
| 4,864,465 A | 9/1989 | Robbins | 361/321 |
| 4,868,711 A | 9/1989 | Hirama et al. | 361/321 |
| 5,010,641 A | 4/1991 | Sisler | 29/830 |
| 5,027,253 A | 6/1991 | Lauffer et al. | 361/313 |
| 5,072,329 A | 12/1991 | Galvagni | 361/321 |
| 5,079,069 A | 1/1992 | Howard et al. | 428/209 |
| 5,144,526 A | 9/1992 | Vu et al. | 361/321 |
| 5,155,655 A | 10/1992 | Howard et al. | 361/303 |
| 5,161,086 A | 11/1992 | Howard et al. | 361/321 |
| 5,162,977 A | 11/1992 | Paurus et al. | 361/401 |
| 5,172,304 A | 12/1992 | Ozawa et al. | 361/401 |
| 5,206,788 A | 4/1993 | Larson et al. | 361/313 |

(List continued on next page.)

OTHER PUBLICATIONS

U.S. application serial No. 09/014,953.
U.S. application serial No. 09/022,258.
U.S. application serial No. 09/186,583.
U.S. application serial No. 09/353,992.
U.S. application serial No. 09/553,715.

Primary Examiner—Anthony Dinkins
(74) Attorney, Agent, or Firm—James A. Lucas; Driggs, Lucas, Brubaker & Hogg Co., LPA

(57) ABSTRACT

A method of forming a capacitive core structure and of forming a circuitized printed wiring board from the core structure and the resulting structures are provided. The capacitive core structure is formed by providing a central conducting plane of a sheet of conductive material and forming at least one clearance hole in the central conducting plane. First and second external conducting planes are laminated to opposite sides of the ground plane with a film of dielectric material between each of the first and second external planes and the central conducting plane. At least one clearance hole is formed in each of the first and second external planes. A circuitized wiring board structure can be formed by laminating a capacitive core structure between two circuitized structures. The invention also relates to the structures formed by these methods.

18 Claims, 4 Drawing Sheets

U.S. PATENT DOCUMENTS

| | | | |
|---|---|---|---|
| 5,261,153 A | * 11/1993 | Lucas | 216/102 |
| 5,428,499 A | 6/1995 | Szerlip et al. | 361/328 |
| 5,469,324 A | 11/1995 | Henderson et al. | 361/301.2 |
| 5,640,761 A | 6/1997 | DiStefano et al. | 29/830 |
| 5,745,333 A | 4/1998 | Frankeny et al. | 361/313 |
| 5,745,334 A | 4/1998 | Hoffarth et al. | 361/313 |
| 5,796,587 A | 8/1998 | Lauffer et al. | 361/373 |
| 5,800,575 A | 9/1998 | Lucas | 29/25.42 |

* cited by examiner

MULTILAYER CAPACITANCE STRUCTURE AND CIRCUIT BOARD CONTAINING THE SAME AND METHOD OF FORMING THE SAME

CROSS REFERENCE TO RELATED APPLICATIONS

This application is a continuation of application Ser. No. 09/655,381, filed Sep. 5, 2000, now U.S. Pat. No. 6,343,001 which is a continuation-in-part of application Ser. No. 09/022,258, filed Feb. 11, 1998, now U.S. Pat. No. 6,256,850 B1, which, in turn, is a division of application No. 08/662,164, filed Jun. 12, 1996, now U.S. Pat. No. 5,796,587.

FIELD OF THE INVENTION

This invention relates generally to multilayer capacitance structures and printed circuit boards containing such structures and methods of manufacturing the same. In more particular aspects, this invention relates to a multilayer capacitance structure which contains generally two power planes and a ground plane, which are self supporting structures, and printed circuit boards embodying the same.

BACKGROUND INFORMATION

The ever-increasing operating speeds and simultaneous switching of electrical devices on printed circuit boards require higher and higher capacitance densities to reduce switching noise and EMI to acceptable levels. The current industry benchmark standard for capacitance structures is a single sheet of epoxy-glass between power and ground planes that provides a capacitance density of approximately 450 pF/in$^2$. This is barely adequate to meet only minimal requirements of present day applications and clearly is not adequate to meet future requirements which will require significantly increased capacitance density.

SUMMARY OF THE INVENTION

A method of forming a capacitive core structure and of forming a circuitized printed wiring board from the core structure and the resulting structures are provided. The capacitive core structure is formed by providing a central conducting plane of a sheet of conductive material and forming at least one clearance hole in the central conducting plane. First and second external conducting planes are laminated to opposite sides of the ground plane with a film of dielectric material between each of the first and second external planes and the central conducting plane. At least one clearance hole is formed in each of the first and second external planes. A circuitized wiring board structure can be formed by laminating a capacitive core structure between two circuitized structures. The invention also relates to the structures formed by these methods.

DESCRIPTION OF THE PREFERRED EMBODIMENTS

Figure 1:
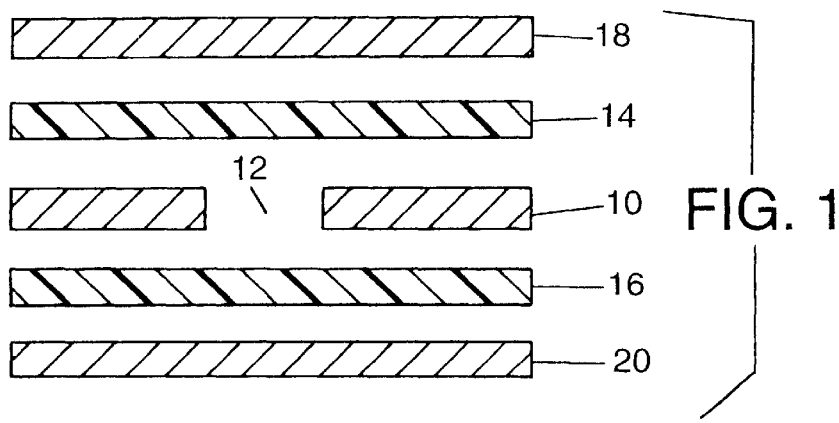
FIG. 1 is a longitudinal, sectional view, somewhat diagrammatic, of the elements of a core member positioned for assembly to form a core member.

Referring now to the drawings, and for the present to FIG. 1, elements of a capacitance core ready for assembly to form the core structure are shown. These elements include a sheet of conducting material 10, preferably copper, which preferably is one or two ounce copper which, in one embodiment, will form a ground plane. In other embodiments, the sheet 10 may form a power plane. The thickness of the sheet 10 is from about 12 microns to about 75 microns. The copper sheet 10 has a clearance hole 12 formed therein. The clearance hole may be formed by drilling, punching or etching using conventional photolithographic techniques. Formation of such a circuit pattern is called personalization. (It is to be understood that only a portion of the various layers of the materials are shown and that typically there may be many holes 12 provided in the sheet 10.) The copper sheet 10 preferably has a "double treat" finish to enhance bond strength for both sides of it. More preferably, copper sheet material 10 is selected from copper foils which exhibit surface treatment roughness which is substantially equal on both sides. Such foils lead to three layer power core structures with well balanced mechanical and electrical properties, such as adhesion, dielectric strength, dielectric constant (Er) and, to a lesser extent, capacitance. Most double treated foils have sides designated as the rough and smooth sides and typically the rough side can be as much as 50% rougher than the smooth side. However, for the present invention, copper foils with rough to smooth differences within 15% are preferred and are considered substantially equal as the term is used herein. One such foil is marketed by Yates Copper and designated TWX/TWX double treat copper foil. Alternatively, the copper sheet 10 may receive an oxide adhesion treatment after the clearance holes 12 have been defined. Such double treat finishes and oxide treatments are well known in the art.

First and second sheets of dielectric material 14 and 16 are disposed on opposite sides of the ground plane 10. Preferably, the dielectric sheets 14 and 16 are formed of FR-4 material which is an epoxy impregnated fiberglass (known as prepreg), such as the material sold under the trademark "DRICLAD" by IBM Corporation, although it may comprise other materials, such as polyimide, cyanate ester, bismaleimide-triazine-epoxy (BT), allylated polyphenylene ether oxide (APPE), polyphenylene ether oxide (PPO), various fluoropolymers (PTFE, FEP, PFA), and various liquid crystal polymers and various other thermo setting and thermoplastic resins as the base dielectric material. It should be understood that, optionally, the fiberglass can be omitted from the construction using slightly different processing steps, such as laminating a resin coated copper to the personalized internal copper.

The sheets 14 and 16 are preferably B-stage cured (i.e. partially but not fully cured). The thickness of each of the sheets 14 and 16 preferably is from about 12 μm to about 50 μm. The dielectric materials 14 and 16 may be modified to increase the dielectric constant by adding a high dielectric constant filler material. High dielectric constant materials, such as barium titanate (BaTiO$_3$), strontium titanate, lead-zirconium titanate, titanium dioxide, tantalum pentoxide, hafnium oxide, or other similar materials may be added. The particulate material typically will be from about 10% to about 50% by volume of the resin/filler or resin/filler fiber matrix. Normal epoxy glass prepregs have dielectric constants in the range of 3.8 to 4.5 which results from their normal resin content range of approximately 12% to approximately 40% by volume of glass cloth with balance being pure epoxy resin. The glass component has a dielectric constant (Er) of approximately 5.8 and the dielectric constant of epoxy resin is approximately 3.7. The dielectric constant of a layer formed from unfilled epoxy resin coated copper is also approximately 3.7.

The previously mentioned high dielectric constant (Er) fillers can be added to either a glass/resin prepreg or a resin coated copper over a range of loadings to obtain a wide range of materials having higher Er values according to the following rule of mixtures formula:

$$\log Km = Ca \log Ka + Cb \log Kb$$

where Km, Ka and Kb are the dielectric constants (Er) of the resin matrix m and components a and b, and where Ca and Cb are the corresponding volume fractions occupied by components a and b.

The maximum loading which can be added is determined by several practical factors including, but not limited to, the shape or morphology of the filler particles, the size distribution of the filler particles, the maximum size of the filler particles, the minimum layer thickness the fabricated material is expected to be formed into, the rheological properties of the base resin and other physical and practical considerations, such as the minimum dielectric strength needed, cost or weight limitations, etc. Dielectric constants (Er) on the order of 20 to 40 can easily be obtained with moderate loadings of several of the higher dielectric constant (Er) fillers previously mentioned. In general, the base resin used, while important for other essential performance properties, is not a big factor in the resulting Er of a filled material of a high Er. This is because the Er's of all the resins basically range from 2.2 to 4.0. The same is generally true for the presence or absence of reinforcing fibers whether these fibers are glass or some organic reinforcement, such as LCP or aramids. Once one begins to add significant amounts of high Er fillers, the Er contributions of the matrix resin and reinforcement become secondary.

Example No. 1: the following mixture was prepared to yield a 60% solids by weight liquid solution containing the resin and solvent mixture referred to as varnish with the correct amount of BaTiO3 to yield a prepreg containing exactly 50% by volume of filler after removal of solvent:

|  | Total | Weight | |
| --- | --- | --- | --- |
| Volume | Weight | Solids | Solids |
| Ciba 8212 epoxy resin, 72% solids in MEK | 27.7 gr. | 20.0 gr. | 12.7 ml. |

|  | Total | Weight | |
| --- | --- | --- | --- |
| Volume | Weight | Solids | Solids |
| BaTiO3 320 mesh | 80.0 gr. | 80.0 gr. | 13.7 ml. |
| Methyl ethyl ketone | 59.0.6 gr. | 0.0 gr. | 0.0 ml. |
| 2-methylimidazole | .0003 gr. | .0003 gr. | n/a |
| Totals | 166.7 gr. | 100.0 gr. | 26.4 |

Conventional glass cloth impregnation methods were used to apply this varnish to 104 style woven E-glass cloth, purchased from Hexcel-Schwebel, Inc. The proper amount of resin was applied to produce a filled prepreg to yield 0.002 inch thickness when laminated. The resin/filler content necessary to produce the 0.002 inch press thickness was 89.4% after all solvent had been removed. For every 128 square inches of 104 cloth weighing 1.63 grams, 13.55 grams (dry weight) of the varnish mix was applied. Immediately after impregnation, the impregnated glass was B-stage cured in an oven at 140° C. for three minutes. The flow of the resulting prepreg material was tested by conventional means and found to be essentially 0%.

The above prepreg was laminated in a conventional flat bed press between two sheets of copper to form various specimens for property testing, as well as the three layer power core structures of this invention. Dielectric constant testing was performed and the dielectric constant (Er) was found to be 26 to 28.

Figure 2:
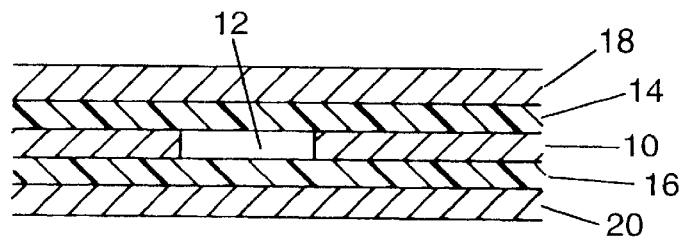
FIG. 2 is a longitudinal, sectional view similar to FIG. 1 showing the elements of FIG. 1 assembled to form a core structure.

Referring to FIG. 2, a pair of sheets of conducting material 18 and 20 are provided on opposite sides of the dielectric films 14 and 16 and also are preferably one ounce or two ounce copper. These will become the power planes in this embodiment. The stack of materials 10, 14, 16, 18 and 20 are laminated together and the epoxy sheets 14 and 16 fully or C-stage cured.

Alternatively, the dielectric material may be coated as a liquid, or applied as a dry film to one or both of the opposing faces of the ground plane 10 or to each of the power planes 18 and 20, or the faces of both the ground plane 10 and power planes 18 and 20. In such a case, one or the other, or both of such coatings, are partially or B-stage cured before lamination. If a coating is applied to both of the opposing faces, i.e. one on the sheet 10 and one on the opposing sheets 16 and 18, one coating may be fully or C-stage cured and the other B-stage cured prior to lamination.

Figure 3:
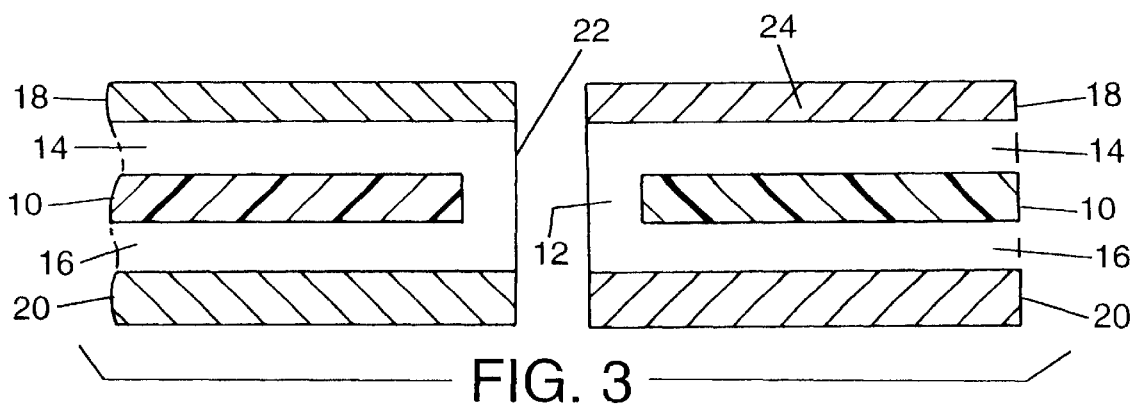
FIG. 3 is a longitudinal, sectional view similar to FIG. 2 showing a hole formed in the core structure.

The structure as shown in FIG. 2 is then drilled to provide a central hole or opening 22 extending entirely through all of the layers of material including entirely through the conducting layers 18 and 20 and the dielectric material layers 14 and 16 and through the opening 12 in the ground plane 10, as shown in FIG. 3.

Figure 4:
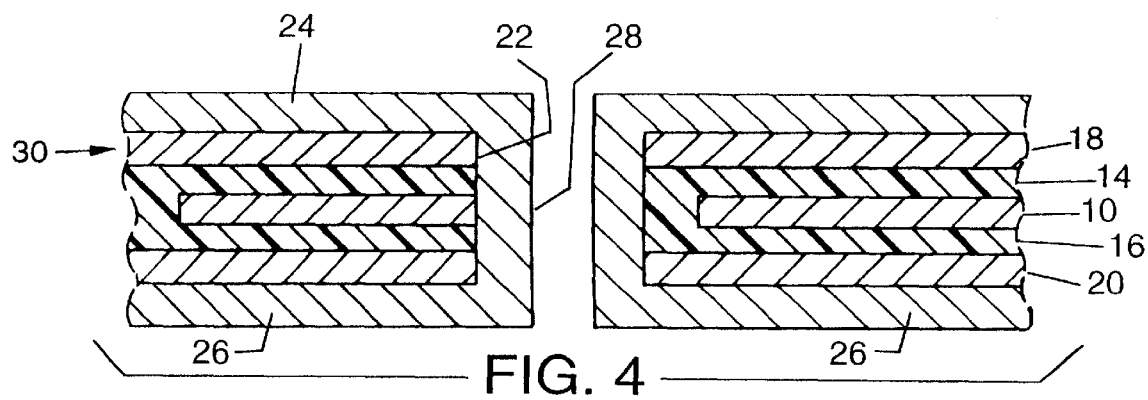
FIG. 4 is a longitudinal, sectional view, somewhat diagrammatic, of the structure of FIG. 3 having conductor material plated on both surfaces and in the hole thereof to form a capacitance core.

The structure shown in FIG. 3 is then plated with a conductive material, such as copper, the plating being on both the faces thereof as shown at 24 and 26 in FIG. 4, and through the opening 22 as shown at 28, constituting a plated through hole. The plating 24, 26 and 28 is preferably electroless copper plating done in a conventional manner by first seeding the surfaces of the copper 18 and 20 and the internal surface 22 with a seed material such as palladium and then electrolessly plating copper. However, other plating techniques, including electroplating, could be employed, and other conducting materials could be used.

Thus, the structure shown in FIG. 4 constitutes a capacitance core 30 having a ground plane 10 and a pair of power planes, layers 18 and 24 constituting one power plane, and layers 20 and 26 constituting another power plane. The thickness of each power plane 18, 24 and 20, 26 is from about 13 μm to about 75 μm. The two power planes are interconnected by the plated through hole 28. (As indicated above, there usually are many plated through holes but only one is shown for illustration purposes.) A core 30 of this particular structure typically has a capacitance of about 20 to about 90 nF/in$^2$. Use of the three layer power cores according to this invention improves composite yields by allowing testing of the voltage/ground dielectric layers prior to composite lamination. Thus, defective cores can be detected and discarded before reading the composite level.

Figure 5:
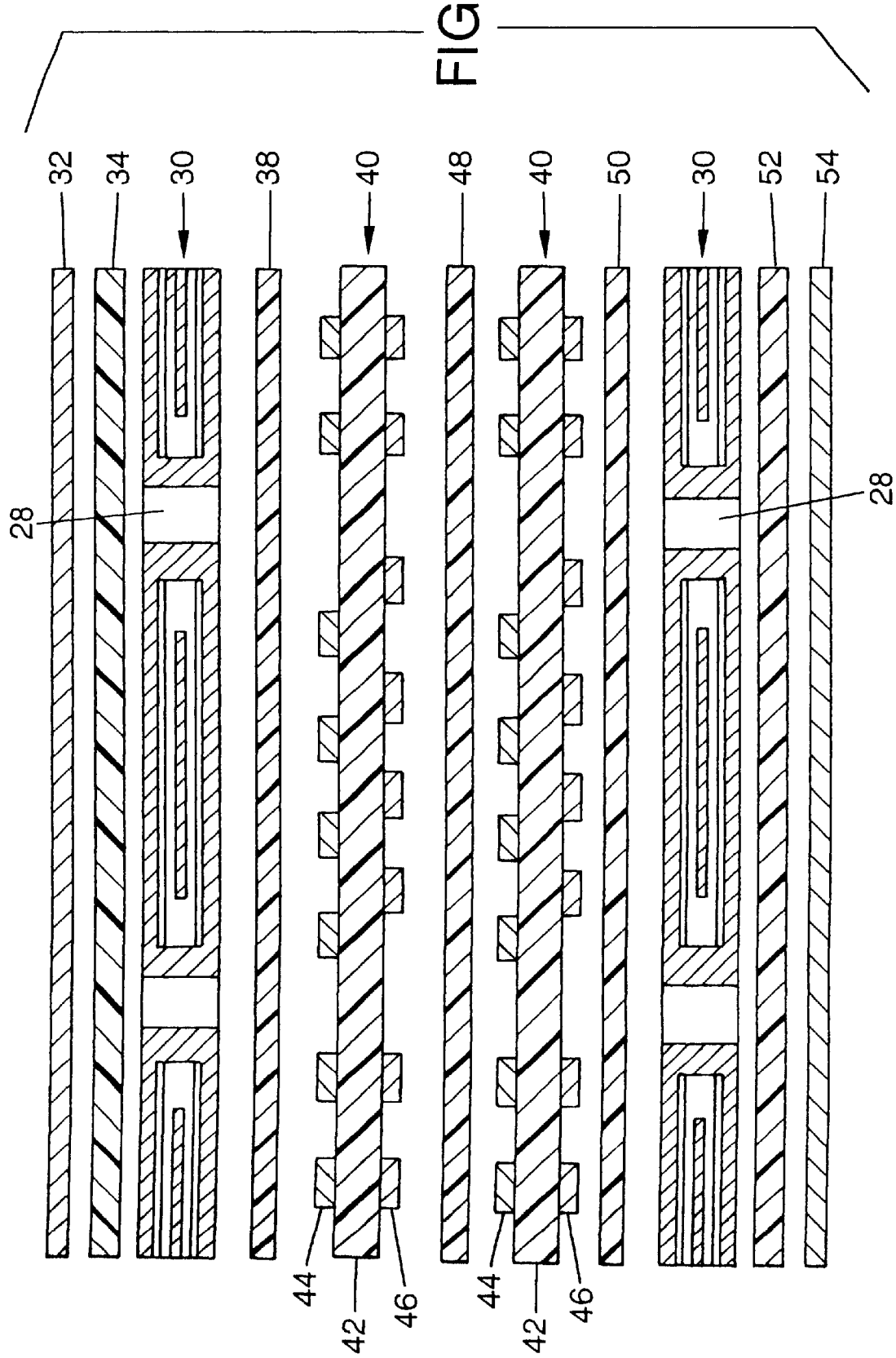
FIG. 5 is an exploded view of the various elements for assembly to form a printed wiring board utilizing two cores formed according to FIGS. 1–4.
Figure 6:
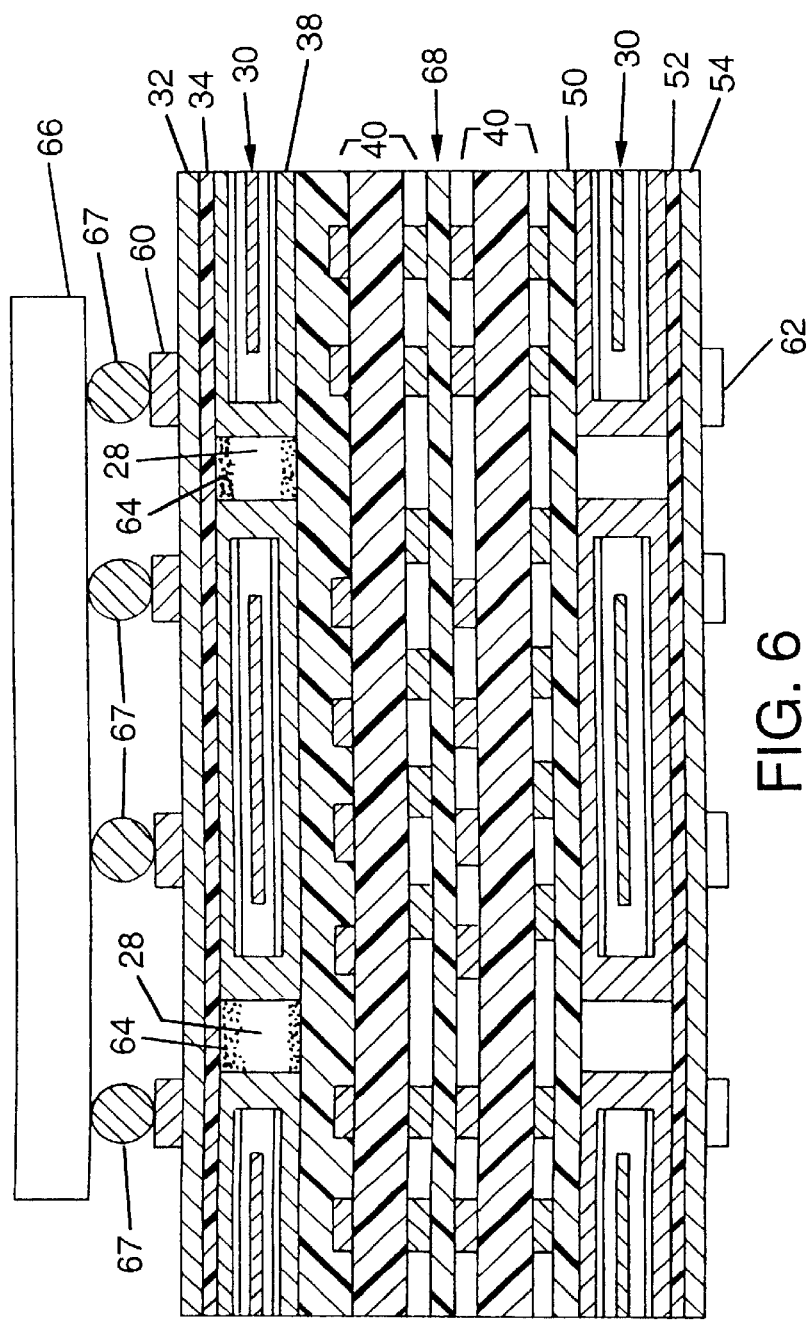
FIG. 6 is a view similar to FIG. 5 showing the elements of FIG. 5 assembled to form a printed circuit board and showing circuitry formed on the opposite sides thereof with an electrical device mounted thereon.

FIGS. 5 and 6 show how two cores 30 are utilized in manufacturing a printed circuit or printed wiring board. As can be seen in FIG. 5, the following components are arranged in a stacked configuration for lamination; a sheet of conducting material 32 which preferably is a sheet of either one ounce or two ounce copper; a dielectric material 34 which in a preferred embodiment is FR4 material epoxy/glass which may have a high dielectric constant filler material of the type described above; a core 30 formed as previously described; a dielectric sheet of material, preferably FR4 38; a circuitized substrate 40 having a dielectric material 42, such as FR4 having circuitization of conducting traces 44 and 46 on opposite sides thereof; a dielectric material 48, such as an FR4 material; a second circuitized substrate 40; another sheet of dielectric material 50, preferably FR4 material; a second core 30 formed as previously described; another sheet of dielectric material 52, again preferably FR4 material and, finally, a second sheet of conducting material, again preferably one or two ounce copper material 54. The total thickness of the circuit substrate 40 is from about 0.005 inch to about 0.050 inch. and the thickness of the dielectric sheets 34, 38, 48, 50 and 52 preferably is from about 0.002 inch to about 0.010 inch. The elements as shown in FIG. 5 are stacked in the relationship as shown therein and then laminated to form the structure shown in FIG. 6. The sheets 34, 38, 48, 50 and 52 are supplied as B-stage cured preferably; and the lamination is carried out at sufficient pressure and heat to fully or C-stage cure the dielectric materials 34, 38, 48, 50 and 52. In such a case, the cores can be supplied with the dielectric material of the cores 30 as C-stage cured.

The laminated structure of FIG. 6 is drilled, plated and circuitized using conventional means known in the industry. The copper sheets 32 and 54 are patterned in a conventional manner to form circuitization 60 and 62 on the dielectric material 34 and 52. It should also be noted that, as can be seen in FIG. 6, the dielectric material from the sheets 34 and 38 is squeezed into the openings 28 in each of the core materials and forms dielectric material 64 therein. The drilled and plated through holes in the laminate structure have not been shown to simplify the drawings, but are common and well known in the industry for interconnecting various layers of the product.

Components, one of which is shown at 66, can then be attached to the circuitization 60 as shown in FIG. 6, which is by ball grid array using solder balls 67. However, other techniques, such as wire bonding, can be used.

Figure 6A:
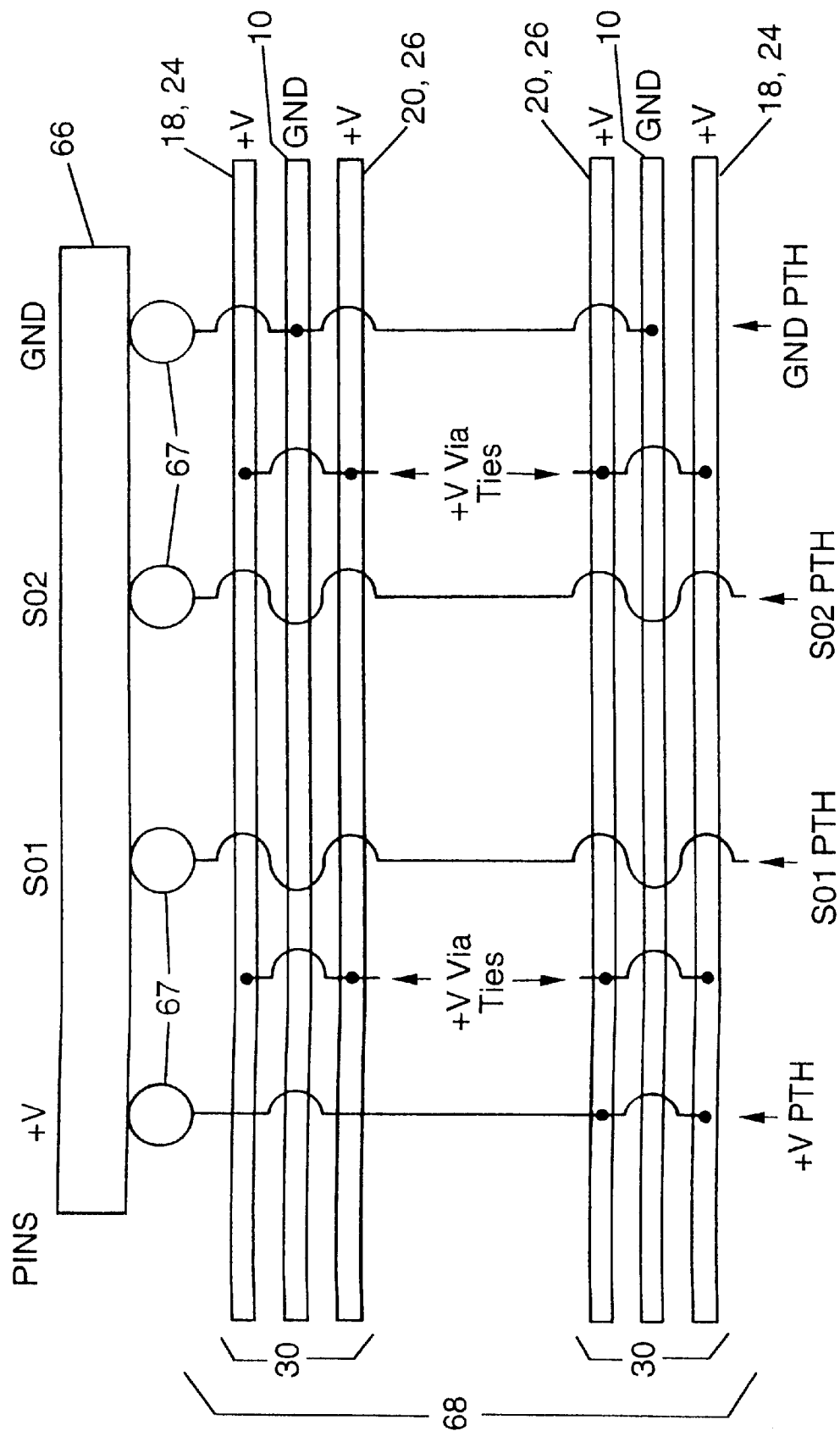
FIG. 6a is a schematic drawing of the connections of a component.

FIG. 6a shows a schematic connection of the component 66 to the signal, ground and power planes.

Thus, a printed circuit or printed wiring board 68 is formed using two cores 30 manufactured as previously described. It is to be understood, however, that different numbers of cores may be used and, for example, only one core may be used or more than two cores may be used depending upon the needs and requirements of the printed wiring board to be finally formed. One of the benefits of the present invention is that preformed multilayer cores of high capacitance can be formed as self supporting structures and later used in the formation of printed circuit boards.

Figure 7:
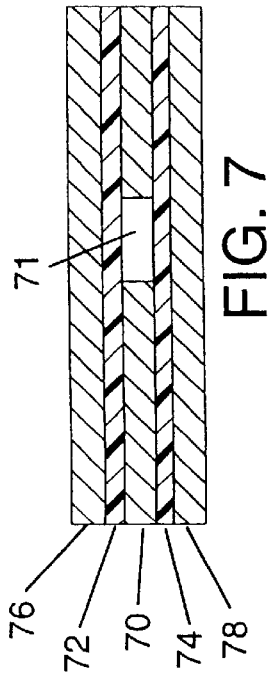
FIG. 7 is a longitudinal, sectional view of another embodiment of a core formed according to this invention.

Referring now to FIG. 7, another embodiment of a capacitance core is shown. In this embodiment, a ground plane 70 of a conductive material has clearance holes, one of which is shown at 71; preferably again one or two ounce copper, is provided. The material 70 is laminated between a pair of dielectric materials 72 and 74, again preferably FR4, and a pair of conductive sheets of material 76 and 78 which provide power planes are also provided. In this embodiment, the conductive planes 76 and 78 are insulated from each other and not connected (through the plated through opening as in the previous embodiment) and, thus, the capacitance for such a core, as shown in FIG. 7, is from about 10 to about 40 nF/in$^2$ per plane. Although the capacitance of the structure of FIG. 7 as compared to that of FIG. 4 is approximately one-half, the structure is useful for providing decoupling where more than one voltage level is required.

While the invention has been described in conjunction with embodiments thereof, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

What is claimed is:

1. A multilayer capacitance structure useful as a core in a circuit board, comprising a first layer of copper defining a central conducting plane and including first and second opposed surfaces having a rough to smooth difference within 15% of one another, the first layer having at least one clearance hole therethrough;

a first layer of dielectric material on said first face of said central conducting plane and a second layer of dielectric material on said second face of said central conducting plane;

a second layer of conductive material on said first layer of dielectric material defining a first exterior plane; and a third layer of conductive material on said second layer of dielectric material defining a second exterior plane, wherein the dielectric material includes an organic resin and a dielectric filler, thereby forming a capacitive structure.

2. The structure according to claim 1 wherein said dielectric material includes an organic resin.

3. The structure according to claim 2 wherein said dielectric material includes an epoxy resin.

4. The structure according to claim 1 wherein said dielectric material includes a dielectric particulate filler.

5. The structure according to claim 1 wherein said structure is buried in a circuit board.

6. The structure according to claim 5 wherein the central conducting plane of said capacitance structure is connected as a ground plane and the external conducting planes are connected as power planes.

7. The structure according to claim 1 wherein the central conductive layer is a ground plane and the external conductive layers are power planes that are insulated from one another, and further wherein the capacitance of the structure is between about 10 and about 40 nF/in$^2$ per plane.

8. The structure according to claim 1 wherein the central conductive layer is a ground plane and the external conductive layers are power planes.

9. The structure according to claim 8 wherein the power planes are insulated from one another.

10. A multilayer capacitance structure useful as a core in a circuit board, comprising a first layer of conductive material defining a central conducting plane serving as a ground plane and including first and second opposed surfaces and having at least one clearance hole therethrough;

a first layer of dielectric material on said first face of said central conducting plane and a second layer of dielectric material on said second face of said central conducting plane;

a second layer of conductive material on said first layer of dielectric material defining a first exterior plane; and a third layer of conductive material on said second layer of dielectric material defining a second exterior plane, wherein said exterior planes are power planes that are insulated from one another whereby the structure has a capacitance between about 10 and about 40 nF/in$^2$ per plane.

11. The structure according to claim 10 wherein the dielectric material comprises an organic resin and a particulate filler.

12. The structure according to claim 10 wherein the opposed surfaces of the ground plane are substantially equal roughness.

13. The structure according to claim 10 wherein the opposed surfaces of the ground plane have a rough to smooth difference within 15% of one another.

14. The structure according to claim 13 wherein the central conducting plane is copper.

15. A multilayer capacitance structure useful as a core in a circuit board, comprising a first layer of copper defining a central conducting plane having first and second opposed surfaces having substantially equal roughness, the first layer having at least one clearance hole therethrough;

a first layer of dielectric material on said first face of said central conducting plane and a second layer of dielectric material on said second face of said central conducting plane;

a second layer of conductive material on said first layer of dielectric material defining a first exterior plane; and a third layer of conductive material on said second layer of dielectric material defining a second exterior plane, thereby forming a capacitive structure.

16. The structure according to claim 15 wherein the opposed surfaces of the central conducting plane have a rough to smooth difference within 15% of one another.

17. The structure according to claim 15 wherein the central conducting plane is a ground plane and the exterior planes are power planes that are insulated from one another, and further wherein the capacitance of the structure is between about 10 and about 40 nF/in$^2$ per plane.

18. The structure according to claim 15 wherein the dielectric material comprises an organic resin and a particulate filler.

* * * * *